(12) United States Patent
Lai et al.

(10) Patent No.: US 7,694,718 B2
(45) Date of Patent: Apr. 13, 2010

(54) HEAT SINK WITH HEAT PIPES

(75) Inventors: Cheng-Tien Lai, Tu-Cheng (TW); Zhi-Yong Zhou, Shenzhen (CN); Yi-San Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 652 days.

(21) Appl. No.: 11/309,811

(22) Filed: Oct. 2, 2006

(65) Prior Publication Data

US 2008/0078528 A1    Apr. 3, 2008

(51) Int. Cl.
*F28D 15/00* (2006.01)
*H05K 7/20* (2006.01)

(52) U.S. Cl. .................. 165/80.3; 165/104.21

(58) Field of Classification Search ........... 165/80.3, 165/104.21, 104.33, 104.34, 185; 361/700, 361/704; 174/15.2, 16.3; 257/715
See application file for complete search history.

(56) References Cited

U.S. PATENT DOCUMENTS

| | | | | |
|---|---|---|---|---|
| 6,102,110 A * | 8/2000 | Julien et al. | ............ | 165/104.33 |
| 6,163,073 A | 12/2000 | Patel | | |
| 6,189,601 B1 * | 2/2001 | Goodman et al. | ........... | 165/80.3 |
| 6,651,732 B2 * | 11/2003 | Sagal | ........................ | 165/80.3 |
| 7,028,758 B2 * | 4/2006 | Sheng et al. | ........... | 165/104.21 |
| 2004/0035558 A1 * | 2/2004 | Todd et al. | ............. | 165/104.26 |
| 2007/0051498 A1 * | 3/2007 | Xia et al. | ..................... | 165/100 |
| 2007/0137846 A1 | 6/2007 | Wang et al. | | |

FOREIGN PATENT DOCUMENTS

| | | |
|---|---|---|
| CN | 2005 2 0120943 | 2/2007 |
| JP | 09189487 A * | 7/1997 |
| TW | 586650 | 5/2004 |
| TW | 587779 | 5/2004 |
| TW | M247921 | 10/2004 |
| TW | M267830 | 6/2005 |
| TW | M288393 | 3/2006 |
| TW | M292729 | 6/2006 |
| TW | I260962 | 8/2006 |

* cited by examiner

*Primary Examiner*—Tho V Duong
(74) *Attorney, Agent, or Firm*—Frank R. Niranjan

(57) ABSTRACT

A heat sink includes a first plate having a top portion and a bottom portion, a second plate projecting from the top portion of the first plate, and a plurality of fins thermally contacting the second plate. The second plate has a width larger than that of the first plate. The heat pipe includes a first portion embedded in the bottom portion of the first plate for directly contacting an electronic component to be cooled, and a second portion bent from one end of the first portion. The second portion is located at one side of the first plate, while the first portion of the heat pipe is located at a middle of the first plate.

12 Claims, 4 Drawing Sheets

HEAT SINK WITH HEAT PIPES

FIELD OF THE INVENTION

The present invention relates to a heat sink for removing heat from heat-generating electronic devices, and more particularly to a heat sink having heat pipes embedded therein.

DESCRIPTION OF RELATED ART

Over the past few years, CPU's operation speeds have been increasing at a dramatic rate. In order to generate rapid speeds, a CPU must have more transistors, draw more power and have higher clock rates. This leads to a great deal of heat being produced by the CPU in the computer. If not been removed in time, the heat can accumulate and overheat the CPU, resulting in degradation of reliability and eventually in system malfunction.

Heat sinks have been added to all modern CPUs to alleviate the effect of the heat on the processor by enabling heat dissipation into the surrounding environment. A typical heat sink generally comprises a base contacting a CPU and a plurality of fins arranged on the base. Most of heat generated by the CPU is absorbed by the base, and is then conducted upwardly from the base to the fins. However, only a part of the base, usually the middle part, contacts the CPU. The heat originating from the CPU is directly absorbed by the middle part of the base and cannot be quickly spread to the other parts of the base. This results in an overheating of the middle part of the base, while the temperature of the other parts of the base is low. The fins on the other parts of the base away from the middle part are not efficiently used. It is therefore desirable to increase the efficiency of the heat sink by sufficient use of all of the fins on the base.

What is needed, therefore, is a heat dissipation device, which can overcome the above-described disadvantages.

SUMMARY OF THE INVENTION

A heat sink comprises a first plate having a top portion and a bottom portion, a second plate projecting from the top portion of the first plate, and a plurality of fins thermally contacting the second plate. The second plate has a width larger than that of the first plate. The heat pipe comprises a first portion embedded in the bottom portion of the first plate for directly contacting an electronic component to be cooled, and a second portion bent from one end of the first portion. The second portion is located at a side of the first plate. Heat generated by the electronic component is firstly received by the first portion of the heat pipe and then transferred to the side of the first plate of the heat sink via the second portion of the heat pipe, so that the heat can be evenly distributed over the first plate before it is dissipated to a surrounding environment through the fins.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
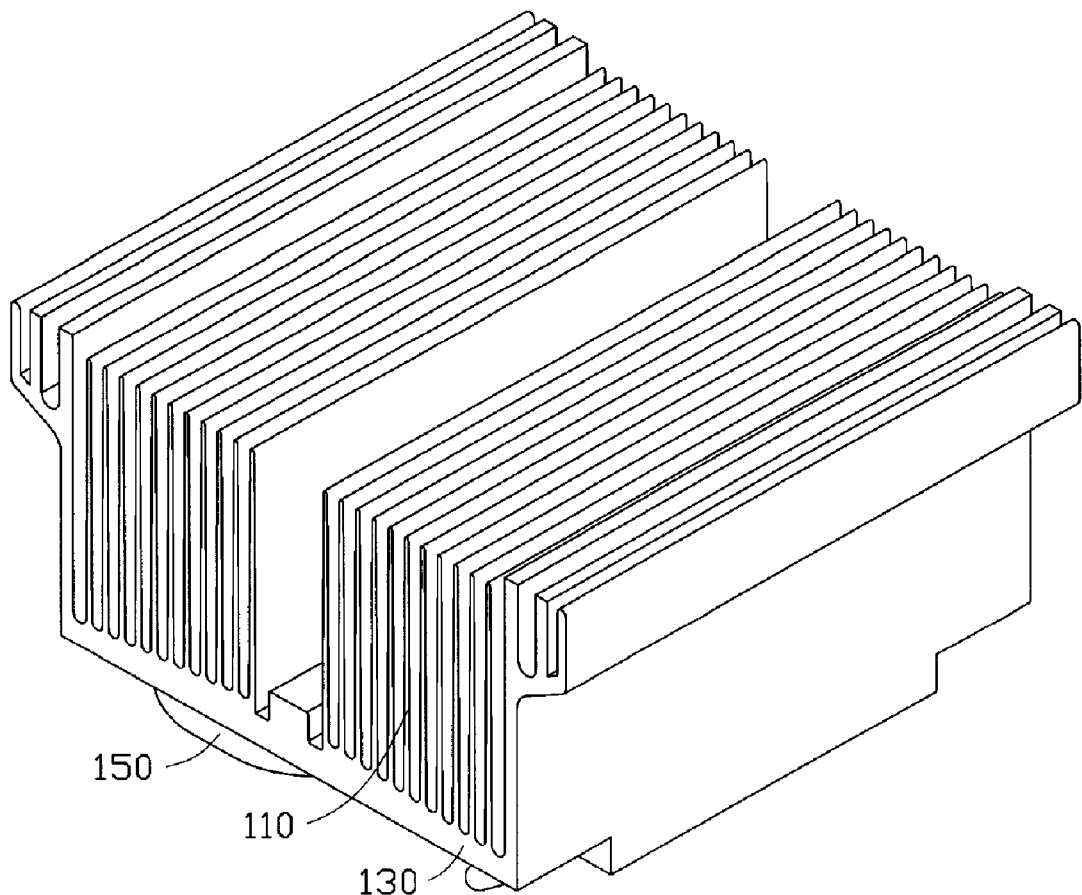
FIG. 1 is an isometric view of a heat sink in accordance with a preferred embodiment.
Figure 2:
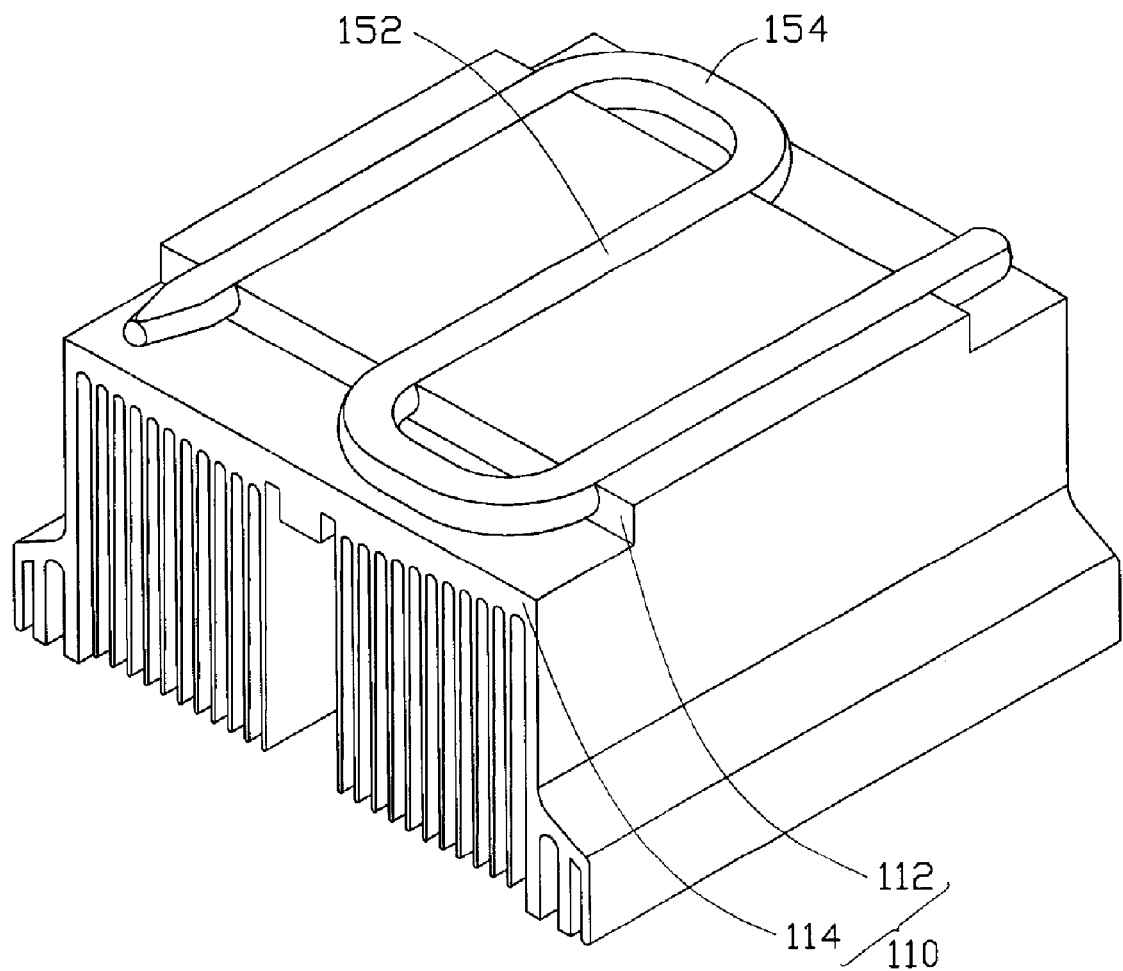
FIG. 2 is a bottom view of the heat sink in FIG. 1.
Figure 3:
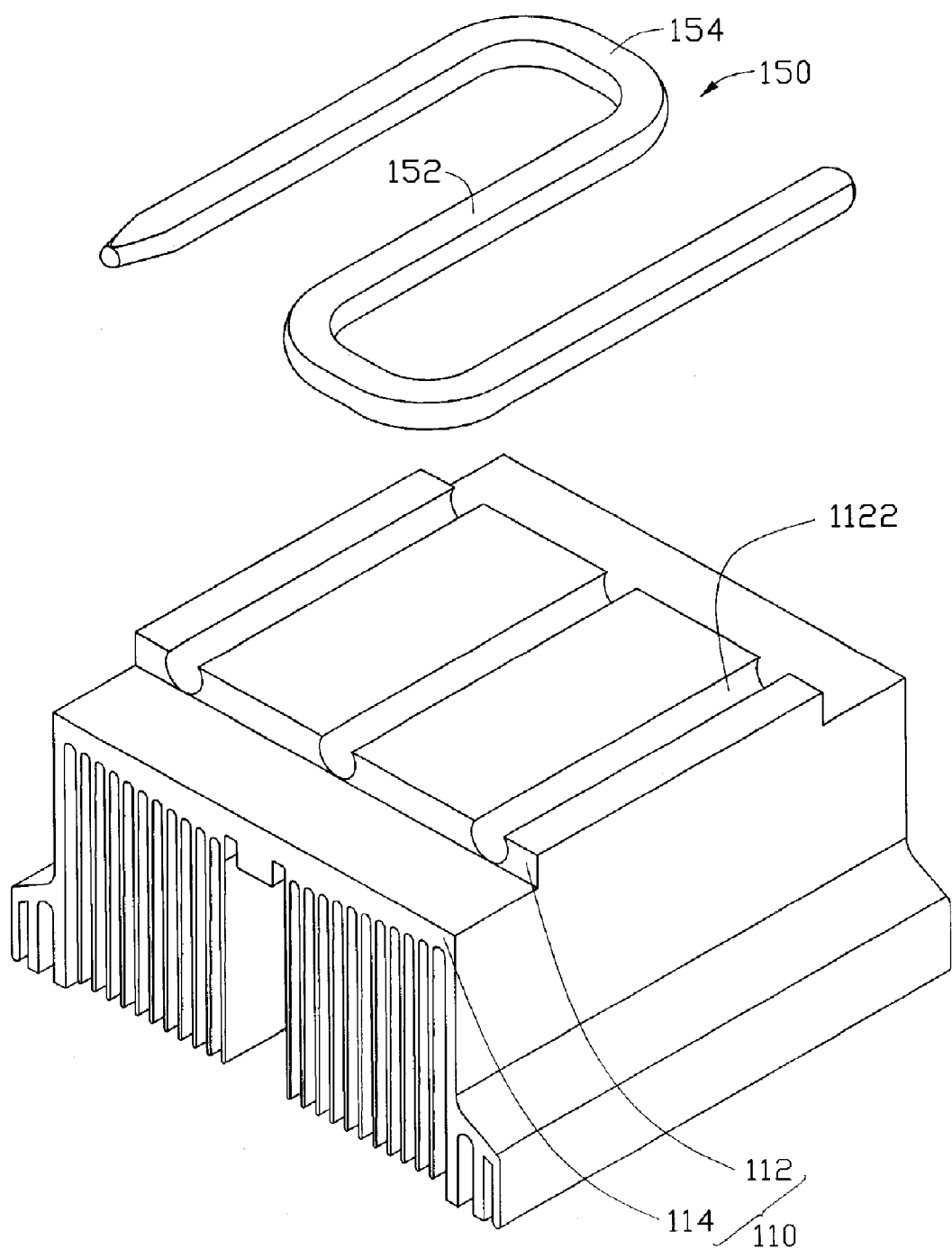
FIG. 3 is an exploded view of the heat sink in FIG. 2.

Referring to FIGS. 1-3, a heat sink 100 in accordance with a preferred embodiment of the present invention is illustrated. The heat sink 100 comprises a base 110, a plurality of fins 130 vertically extending from the base 110, and an S-shaped heat pipe 150 embedded in a bottom portion of the base 110.

The base 110 is made of heat conductive material, such as aluminum, copper, and has a first plate 112 and a second plate 114 projecting upwardly from the first plate 112 for supporting the fins 130. The first plate 112 is proximate to an electronic component, such as a central processing unit (CPU) to be cooled.

The first plate 112 has a width smaller than that of the second plate 114, as a result, two steps (not labeled) are respectively formed at opposite sides of the first plate 112. Three straight grooves 1122 are defined parallel and spaced apart in a bottom portion of the first plate 112 for accommodating the heat pipe 150. Each of the grooves 1122 has a depth substantially the same as a height of the first plate 112 so that the second plate 114 is exposed to the grooves 1122. One groove 1122 is located in a middle portion of the first plate 112, and the other two grooves 1122 are positioned near respective opposite side ends of the first plate 112.

The S-shaped heat pipe 150 comprises three parallel first portions 152, and two second portions 154 interconnecting the neighboring first portions 152. The second portions 154 are perpendicularly bent from opposite ends of a middle one of the first portions 152 along opposite directions, and extend between neighboring first portions 152.

The first portions 152 of the heat pipe 150 are respectively retained in the grooves 1122 of the first plate 112 via riveting or pressing; as a result, the first portions 152 of the heat pipe 150 directly and tightly contact the first plate 112 and the second plate 114 without solder or other material. Thus, the heat resistance between the heat pipe 150 and the first plate 112 and the second plate 114 is reduced. Alternatively, the first portions 152 of the heat pipe 150 may be attached to the first plate 112 via welding or soldering.

After the first portions 152 of the heat pipe 150 are installed in the grooves 1122 of the first plate 112, the second portions 154 of the heat pipe 100 are positioned at opposite sides of the first plate 112, and parallel to sidewalls of the first plate 112. Therefore, the second portions 154 of the heat pipe 150 are positioned in a space cooperatively defined by edges of the first plate 112 and edges of the second plate 114, and the whole heat pipe 150 is positioned in a range defined by the edges of the second plate 114. In this embodiment, the first portions 152 of the heat pipe 100 tightly abut against the first and second plates 112, 114, while the second portions 154 of the heat pipe 150 abut against the second plate 114.

During operation, the heat sink 100 is positioned on a top surface of the CPU with one first portion 152 of the heat pipe 100, particularly the middle one, aligned over the CPU. The middle first portion 152 of the heat pipe 100 serves to absorb heat originating from the CPU, and serves as an evaporator for the heat pipe 100. The absorbed heat is then transferred to the rightmost and leftmost first portions 152 respectively via the second portions 154 along opposite directions. The heat of the rightmost and leftmost first portions 152 of the heat pipe 150 is conducted to the first and second plates 112, 114, and the rightmost and leftmost first portions 152 of the heat pipe 150 serve as two condensers for the heat pipe 150. Finally, the heat accumulated at the base 110 is upwardly conducted to the fins 130 to be dissipated.

Thus, the heat originating from the CPU can be quickly absorbed by the first portion 152, which is arranged at the central portion of the first plate 112, and then be quickly spread to the other parts of the first plate 112 by the rightmost and leftmost first portions 152 of the heat pipe 150. As a result, uniform temperature distribution over the whole first plate 112 is achieved. This serves to uniformly transfer the heat from the base 110 to the fins 130 and to improve the utilization of the fins 130 to dissipate the heat; thus, the efficiency of the heat sink 100 is promoted.

Moreover, each second portion 154 of the heat pipe 150 has one side abutting the second plate 114 and an opposite side exposed to ambient air. Therefore, the second portions 154 of the heat pipe 150 can transfer the heat to the second plate 114 and the ambient air, simultaneously. The provision of the two steps of the first plate 112 helps an airflow which can easily reach the first plate 112, whereby the heat distributed over the first plate 112 can be more easily dissipated to the ambient air.

For facilitating mounting the heat sink 100 on the CPU, the heat sink 100 defines a channel 160 in a middle portion of the fins 130 for a clip being positioned therein.

Figure 4:
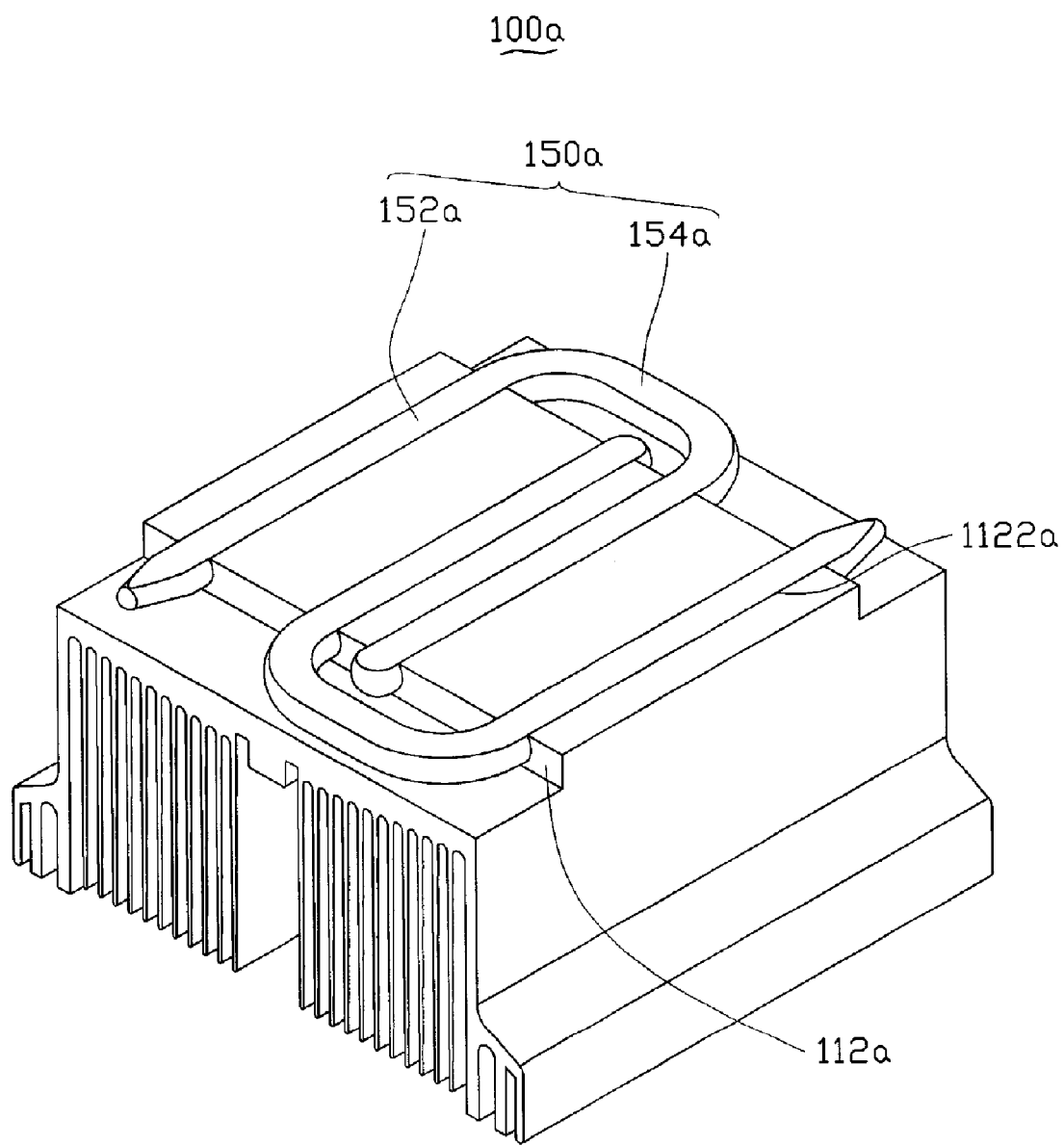
FIG. 4 is a bottom view of a heat sink in accordance with another preferred embodiment.

FIG. 4 shows a bottom plan view of a heat sink 100a in accordance with another preferred embodiment. The heat sink 100a has a similar structure to the heat sink 100 as described above. The main difference is the arrangement of the heat pipes in the first plate 112a. The heat sink 100a comprises four straight grooves 1122a defined on the first plate 112a and two U-shaped heat pipes 150a. Each heat pipe 150a has two parallel first portions 152a embedded in the corresponding grooves 1122a of the first plate 112a, and a second portion 154a interconnecting the first portions 152a. One of the first portions 152a of each of the U-shaped heat pipes 150a is located between the two first portions 152a of the other U-shaped heat pipe 150a. The second portions 154a of the heat pipes 150a are positioned at opposite sides of the first plate 112a.

In this embodiment, the two heat pipes 150a are so oriented that they open towards different directions, and each has one first portion 152a extending into space defined by the other heat pipe 150a. Moreover, the heat pipes 150a have two first portions 152a closely arranged in a center portion of the first plate 112a, which is typically corresponds to a position for a CPU.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
a first plate having a top portion and a bottom portion;
a second plate projecting from the top portion of the first plate, the second plate having a width larger than that of the first plate;
a plurality of fins thermally contacting the second plate; and
a heat pipe comprising a first portion embedded in the bottom portion of the first plate adapted for directly contacting an electronic component to be cooled, and a second portion bent from one end of the first portion, the second portion being located at one side of the first plate, the second portion having at least a part extending out of the first plate and below the second plate;
wherein the heat pipe is substantially S-shaped, and the first portion is located at a middle of the heat pipe.

2. The heat sink as claimed in claim 1, wherein the at least a part of the second portion of the heat pipe is positioned in a range cooperatively defined by an edge of the first plate and an edge of the second plate.

3. The heat sink as claimed in claim 1, wherein two steps are formed at opposite sides of the first plate.

4. The heat sink as claimed in claim 1, wherein the first portion of the heat pipe directly contacts the first plate and the second plate.

5. The heat sink as claimed in claim 1, wherein the heat sink defines a channel in a middle portion of the fins, adapted for positioning a clip therein.

6. The heat sink as claimed in claim 1 wherein the second portion is at opposite sides of the first plate.

7. The heat sink as claimed in claim 1, wherein the first and second portions of the heat pipe are positioned in a plane parallel to a bottom surface of the first plate.

8. A heat sink comprising:
a first plate having a bottom portion and a top portion;
a second plate extending from the top portion of the first plate, the second plate having an area different from that of the first plate;
a plurality of fins mounting on the second plate; and
a heat pipe having one portion embedded in the bottom portion of the first plate, adapted for directly contacting with a heat-generating electronic component, and another portion extending from the one portion of the heat pipe through a part of first plate distant from the one portion of the heat pipe;
wherein the heat pipe is S-shaped, and comprises three parallel first portions embedded in the first plate and two second portions interconnecting neighboring first portions, wherein the second portions are at opposite sides of the first plate, the one portion of the heat pipe being a middle one of the three first portions of the heat pipe.

9. The heat sink as claimed in claim 8, wherein the heat pipe is in a range defined by edges of the second plate.

10. A heat sink comprising:
a first plate;
a second plate located over the first plate and being larger than the first plate;
a plurality of fins extending upwardly from the second plate; and
a heat pipe having an evaporator embedded in the first plate, adapted for directly contacting with a heat-generating electronic component, and a condenser extending from the evaporator to thermally connect with a part of the first plate which is distant from the evaporator of the heat pipe;
wherein the heat pipe is S-shaped, and comprises three parallel first portions embedded in the first plate and two second portions interconnecting neighboring first portions, wherein the second portions are at opposite sides of the first plate, the evaporator of the heat pipe being a middle one of the three first portions of the heat pipe and the condenser of the heat pipe being sideways ones of the three first portions of the heat pipe.

11. The heat sink as claimed in claim 10, wherein the second portions are located outside of the first plate and located below the second plate.

12. The heat sink as claimed in claim 11, wherein at least a step is defined between the first plate and the second plate.

* * * * *